United States Patent
Kawai et al.

(10) Patent No.: US 9,823,880 B1
(45) Date of Patent: Nov. 21, 2017

(54) METHOD AND APPARATUS FOR INITIATING PRE-READ OPERATION BEFORE COMPLETION OF DATA LOAD OPERATION

(71) Applicant: Intel Corporation, Santa Clara, CA (US)

(72) Inventors: Koichi Kawai, Yokohama (JP); Tomoharu Tanaka, Yokohama (JP)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/281,439

(22) Filed: Sep. 30, 2016

(51) Int. Cl.
  *G11C 7/00* (2006.01)
  *G06F 3/06* (2006.01)
  *G11C 16/04* (2006.01)
  *G11C 16/26* (2006.01)

(52) U.S. Cl.
  CPC .......... *G06F 3/0659* (2013.01); *G06F 3/064* (2013.01); *G06F 3/0611* (2013.01); *G06F 3/0665* (2013.01); *G06F 3/0679* (2013.01); *G11C 16/0408* (2013.01); *G11C 16/26* (2013.01)

(58) Field of Classification Search
  CPC ...... G06F 3/0659; G06F 3/0611; G06F 3/064; G06F 3/0665; G06F 3/0679; G06F 3/0408
  See application file for complete search history.

(56) References Cited

U.S. PATENT DOCUMENTS

| | | | | |
|---|---|---|---|---|
| 5,982,663 A | * | 11/1999 | Park | G11C 11/5621 365/185.03 |
| 7,173,863 B2 | * | 2/2007 | Conley | G06F 12/0862 365/189.04 |
| 8,929,146 B1 | * | 1/2015 | Asnaashari | G06F 3/0688 365/158 |
| 9,275,741 B1 | * | 3/2016 | Liang | G11C 16/10 |

* cited by examiner

*Primary Examiner* — Pho M Luu
(74) *Attorney, Agent, or Firm* — Patent Capital Group

(57) ABSTRACT

In one embodiment, an apparatus comprises a storage device comprising a NAND flash memory array, the storage device to program, during a first programming pass, a plurality of cells of a first wordline of the NAND flash memory array to store a first page of data; initiate a read of the first page of data prior to completion of loading of a second page of data to be programmed during a second programming pass; and program, during the second programming pass, the plurality of cells of the first wordline of the NAND flash memory array to store the first page of data and the second page of data.

20 Claims, 7 Drawing Sheets

FIG. 3
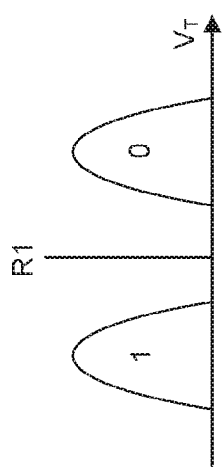
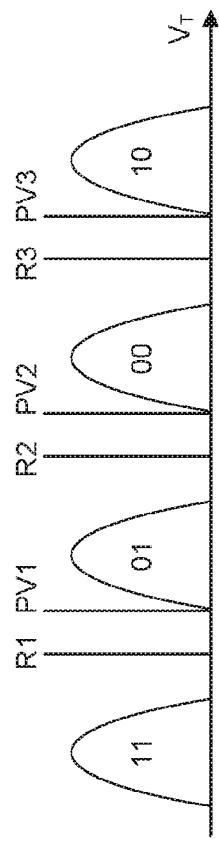
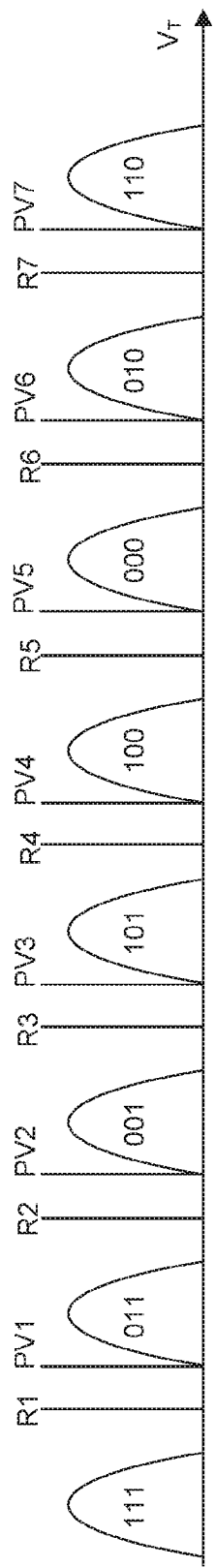

METHOD AND APPARATUS FOR INITIATING PRE-READ OPERATION BEFORE COMPLETION OF DATA LOAD OPERATION

FIELD

The present disclosure relates in general to the field of computer development, and more specifically, to NAND flash memory.

BACKGROUND

A computer system may include one or more central processing units (CPUs) coupled to one or more storage devices. A CPU may include a processor to execute an operating system and other software applications that utilize the storage devices coupled to the CPU. The software applications may write data to the storage devices. The data may be stored by the storage devices in a plurality of memory cells (e.g., NAND flash memory cells) of the storage devices.

BRIEF DESCRIPTION OF THE DRAWINGS

FIG. 3 illustrates example encoding schemes for NAND flash memory cells in accordance with certain embodiments.

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
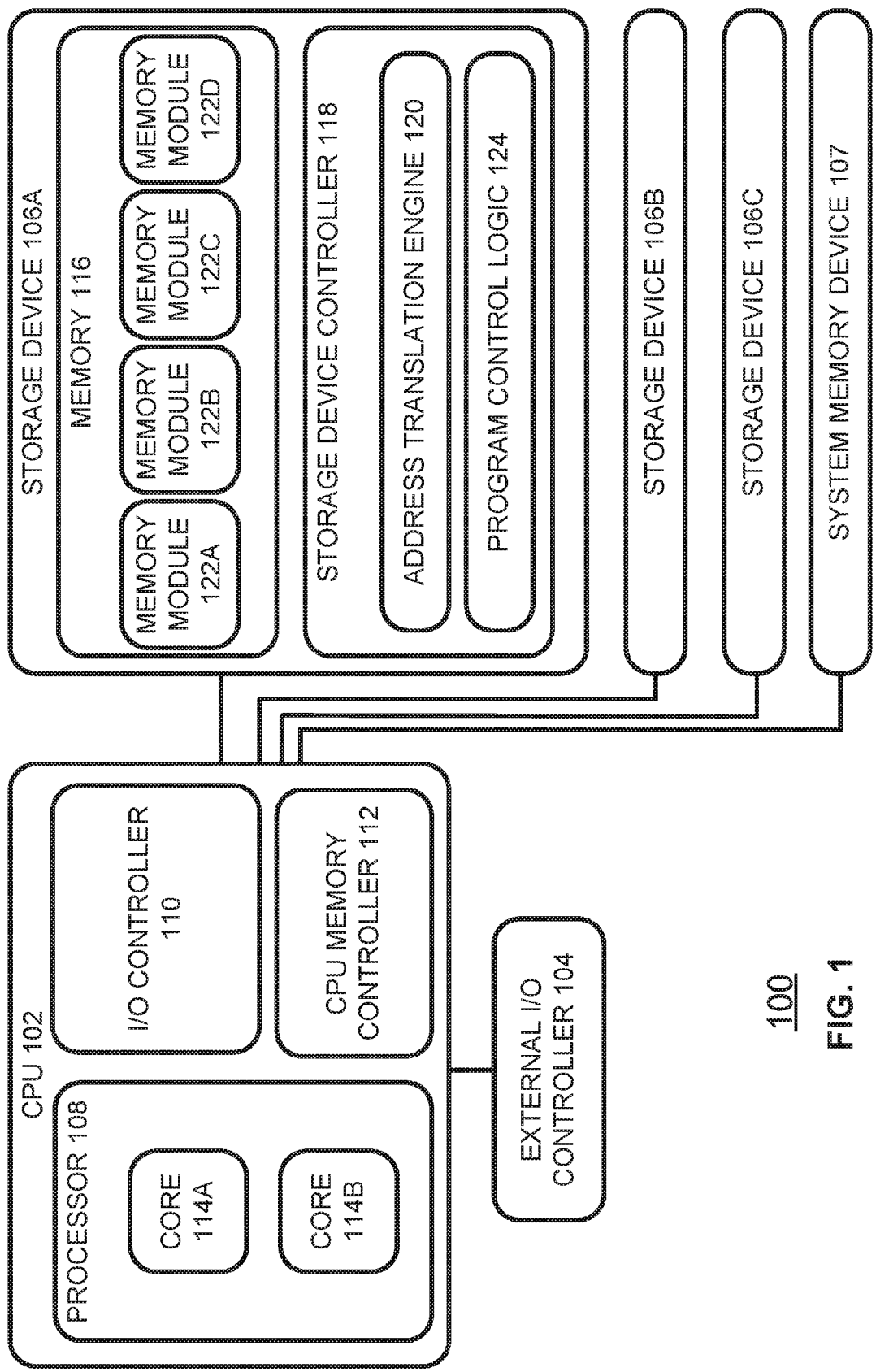
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a plurality of storage devices 106A, 106B, and 106C (storage devices 106B and 106C may perform in similar manners to storage device 106A and/or may have any suitable characteristics of storage device 106A), and system memory device 107. During operation, data may be transferred between storage device 106A or system memory device 107 and the CPU 102. In various embodiments, particular data operations (e.g., erase, program, and read operations) involving a storage device 106A or system memory device 107 may be managed by an operating system or other software application executed by processor 108.

In various embodiments, a storage device 106A comprises NAND flash memory (herein a storage device comprising NAND flash memory is referred to as a NAND flash storage device). In some embodiments, storage device 106A may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A programming sequence for a group of memory cells may comprise programming of all of the intended pages into the group of cells. A programming sequence may include one or more programming passes. A programming pass (which may comprise one or more programming loops) may encode one or more pages in the group of cells (where each page corresponds to a bit stored in a cell). A programming pass may comprise the application of one or more effective program voltages to cells to be programmed followed by the application of one or more verify voltages to these cells in order to determine which cells have finished programming.

When the data of the page(s) that are programmed during the first programming pass are loaded, they may be stored in memory elements (such as one or more sets of latches) which control the values that are programmed into the group of cells. However, prior to the second programming pass, the page data may be lost (e.g., the memory elements may be overwritten by one or more other pages that are to be written to another group of cells). Since the target level of each cell is based on the combination of bits to be programmed into a cell, the data of the page(s) programmed during the first programming pass should be accessed in combination with the data of the page(s) to be programmed during the second programming pass.

In various embodiments, before a second programming pass is performed on a particular group of cells, the page(s) that were programmed in the first programming pass are read from the cells in a "pre-read" operation. In some systems, the pre-read of the lower page(s) that are already stored in a group of cells is performed after all of the data of the upper page(s) destined for those cells have been loaded from a host. However, such systems introduce unnecessary latency into the programming sequence. Various embodiments herein provide systems and methods for initiating (and/or completing) the pre-read operation prior to completion of the data load operation, such that at least a portion of the pre-read operation is performed in parallel with the data load operation, thus providing various technical advantages such as reducing the program time without introducing signal degradation.

A storage device 106A may include any number of memories 116 and each memory 116 may include any number of memory modules 122A-D. In the embodiment depicted, memory device 116 includes memory modules 122A-D (while reference may be made herein to memory module 122A specifically, any of the memory modules may have any suitable characteristics of memory module 122A).

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106A coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106A to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other device) of computer system 100.

In various embodiments, a system memory device 107 may include a memory comprising any number of memory modules, a memory device controller, and other supporting logic (not shown). A memory module may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106A may store any suitable data, such as data used by processor 108 to provide functionality of computer system 100. For example, data associated with programs that are executed or files accessed by cores 114A and 114B may be stored in storage device 106A. Thus, in some embodiments, a storage device 106A may function as a system memory that stores data and/or sequences of instructions that are executed or otherwise executed by the cores 114A and 114B. In various embodiments, a storage device 106A may store persistent data (e.g., a user's files or software application code) that remains stored even after power to the storage device 106A is removed. A storage device 106A may be dedicated to CPU 102 or shared with other devices (e.g., another CPU or other device) of computer system 100.

In the embodiment depicted, storage device 106A includes a storage device controller 118 and one memory 116 comprising four memory modules 122A-D operable to store data, however, a storage device may include any suitable number of memory modules. A memory module 122A includes a plurality of memory cells that are each operable to store one or more bits. The cells of a memory module 122A may be arranged in any suitable fashion, such as in rows (e.g., wordlines) and columns (e.g., bitlines), three dimensional structures, or other manner. In various embodiments, the cells may be logically grouped into banks, blocks, subblocks, wordlines, pages, frames, bytes, or other suitable groups. In various embodiments, a memory module 122A comprises one or more NAND flash memory arrays. NAND flash memory arrays are described in more detail in connection with FIG. 2.

A memory module 122A may include any of the volatile or non-volatile memories listed above or other suitable memory. In particular embodiments, memory module 122A includes non-volatile memory, such as planar or 3D NAND flash memory. In particular embodiments, a memory module 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106A comprising NAND flash memory may receive a command that has a format compliant with a DDR-based standard and may translate the command into one or more commands that are compatible with NAND flash memory of the storage device 106A. Similarly, the storage device 106A may format results from operations performed on the NAND flash memory into a format that is compliant with a DDR-based standard before transmitting the results to the CPU 102.

In a particular embodiment, a memory 116 is a semiconductor package. In various embodiments, a semiconductor package may comprise a casing comprising one or more semiconductor dies (also referred to as chips). A package may also comprise contact pins or leads used to connect to external circuits. In a particular embodiment, each memory module 122A is embodied on its own die. Accordingly, in some embodiments, a memory 116 may be a package that includes a plurality of dies that each include a memory module 122A. However, a package is merely one example of a form a memory 116 may take as a memory device may be any suitable arrangement of one or more memory modules and associated logic in any suitable physical arrangement. For example, although a single physical package may include a single memory 116, multiple memories 116 could be resident on a single package or a memory 116 could be spread across multiple packages. As another example, a memory 116 may be embodied in one or more different physical mediums, such as a circuit board, die, disk drive, other medium, or any combination of thereof (or combination with one or more packages). Similarly, a die is merely one example of a memory module 122A, as a memory module 122A may be any suitable arrangement of memory cells and logic associated with the memory cells. For example, although a single die may include a single memory module 122A, multiple memory modules could be resident on a single die or a memory unit could be spread across multiple dies. As another example, a memory module 122A may be embodied in one or more different physical mediums, such as a circuit board, package, disk drive, other medium, or any combination of thereof (or combination with one or more dies).

Storage device 106A may comprise any suitable type of memory and is not limited to a particular speed, technology, or form factor of memory in various embodiments. For example, a storage device 106A could be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106A may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106A may also include a communication interface to communicate with CPU memory controller 112 or I/O controller 110 in accordance with any suitable logical device interface specification such as NVMe, AHCI, or other suitable specification. In particular embodiments, storage device 106A may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory unit(s) thereon), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106A such as the temperature or voltage and report associated statistics to the CPU 102. Storage device controller 118 can be implemented on the same board or device as a memory 116 or on a different board, or device. For example, in some environments, storage device controller 118 may be a centralized storage controller that manages memory operations for multiple different memories 116 (which could each be of the same type of memory or could be of different types) of computer system 100 (and thus could provide storage device controller functionality described herein to any of the memories to which it is coupled).

In various embodiments, the storage device 106A also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a computing host coupled to the storage device 106A) and the physical address space of the memory 116 of the storage device 106A (which may or may not be exposed to the computing host). The logical address space may expose a plurality of logical groups of data which are physically stored on corresponding physical groups of memory addressable through the physical address space of the storage device 106A. A physical address of the physical address space may comprise any suitable information identifying a physical memory location (e.g., a location within a memory of a memory 116) of the storage device 106A, such as an identifier of the memory 116 on which the physical memory location is located, an identifier of the memory module 122A on which the physical memory location is located (e.g., a logical unit number), one or more pages of the physical memory location, one or more subblocks of the physical memory location, one or more wordlines of the physical memory location, one or more bitlines of the physical memory location, or other suitable identifiers or encodings thereof.

The address translation engine 120 or other portion of storage device 106A may include any suitable memory type for storing logical to physical mapping structures and other information and any suitable logic for changing values stored in the logical to physical mapping structures and other information (e.g., in response to a request from the storage device controller 118) and reading values from the logical to physical mapping structures and other information (e.g., to provide the values to the storage device controller 118 for use in memory operations).

Storage media for the logical to physical mapping structures and other information may be included within the address translation engine 120 and/or storage device controller 118 or may be communicably coupled to the address translation engine and/or storage device controller. In various embodiments, storage media for the logical to physical mapping structures and other information may be integrated on the same package or chip as the storage device controller 118 and/or address translation engine 120 or may be implemented on a separate package or chip.

In various embodiments, the address translation engine 120 and/or storage device controller 118 may provide wear leveling through management of the address mappings of the logical to physical mapping structures and other information. In particular embodiments, the address translation engine 120 and/or storage device controller 118 may also prevent the use of bad memory cells (or logical grouping of cells) by not allowing physical addresses for the bad cells (or logical grouping of cells) to be mapped to the logical address space.

In various embodiments, the storage device 106A also includes program control logic 124 which is operable to control the programming sequence performed when data is written to or read from a memory 116. In various embodiments, program control logic 124 may provide the various voltages (or information indicating which voltages should be provided) that are applied to the memory cells during the programming and/or reading of one or more pages of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory modules 122A.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106A may be located on a single chip or on multiple chips. In various embodiments a storage device 106A and a computing host (e.g., CPU 102) may be located on the same circuit board or on the same device and in other embodiments the storage device 106A and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106A may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
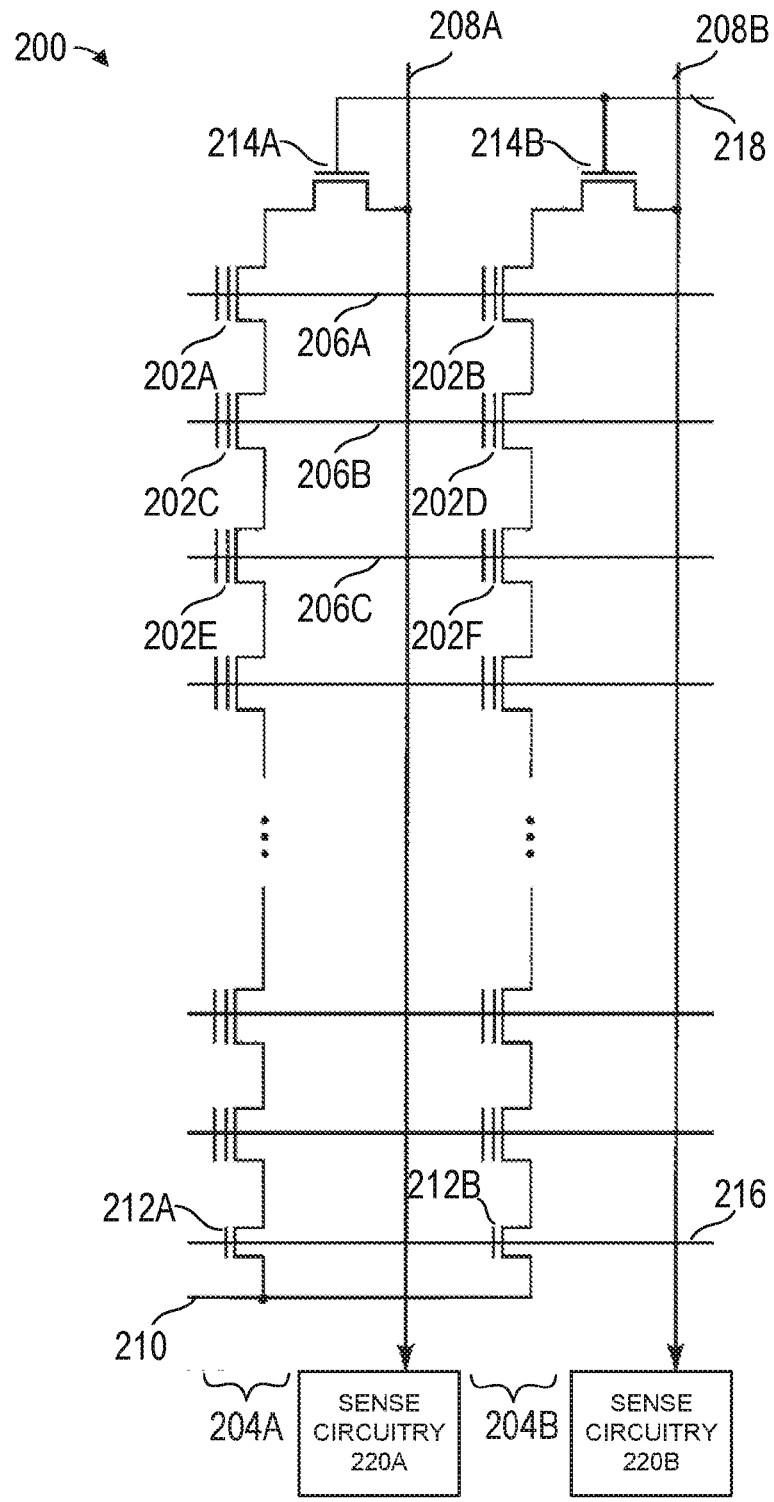
FIG. 2 illustrates an example diagram of a portion of a NAND flash memory array in accordance with certain embodiments.

FIG. 2 illustrates an example diagram of a portion of a NAND flash memory array 200 in accordance with certain embodiments. In various embodiments, a memory module 122A may comprise one or more NAND flash memory arrays. NAND flash memory array 200 may comprise a plurality of non-volatile memory cells 202 arranged in columns such as series strings 204. In various embodiments, a memory cell 202 may comprise a transistor with a floating gate that stores charge indicative of one or more bit values stored by the memory cell 202. In the series strings 204, the drains of the cells 202 are each (with the exception of the top cell) coupled to a source of another cell 202.

The array 200 also includes wordlines 206. A wordline 206 may span across multiple series strings 204 (e.g., a wordline may be coupled to one memory cell of each series string 204) and are connected to the control gates of each memory cell 202 of a row of the array 200 and used to bias the control gates of the memory cells 202 in the row. The bitlines 208 are each coupled to a series string 204 by a drain select gate 214 and sensing circuitry 220 that detects the state of each cell by sensing voltage or current on a particular bitline 208.

Each series string 204 of memory cells is coupled to a source line 210 by a source select gate 212 and to an individual bitline 208 by a drain select gate 214. The source select gates 212 are controlled by a source select gate control line 216 and the drain select gates 214 are controlled by a drain select gate control line 218.

In various embodiments, each memory cell 202 can be programmed according to an SLC, MLC, TLC, a QLC, or other encoding scheme. Each cell's threshold voltage (Vt) is indicative of the data that is stored in the cell. FIG. 3 illustrates example encodings of bits within NAND flash memory cells 202 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of the cells are being read. When a particular read voltage is applied, sense circuitry 220 may determine whether the threshold value of a cell is greater than or less than the read voltage based on a voltage or current sensed by the sense circuitry 220 via the bitline of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell to determine whether the threshold voltage of the cell has reached its desired level.

In particular embodiments, cells may be programmed one or more pages at a time, where a page is stored in a group of cells that are coupled to the same wordline. As one example, the group of cells may be identified by a particular wordline and a particular subblock. As another example, the group of cells may represent all of the cells of the wordline. The group of cells may store one page of data (if the cells are encoded according to an SLC scheme) or multiple pages of data (if the cells are encoded according to an MLC, TLC, QLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline. For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A programming sequence for a group of cells may comprise programming of all of the intended pages into the group of cells. A programming sequence may include one or more programming passes. A programming pass (which may comprise one or more programming loops) may encode one or more pages. A programming pass may comprise the application of one or more effective program voltages to cells to be programmed followed by the application of one or more verify voltages to these cells in order to determine which cells have finished programming. In some embodiments, one or more loops of a programming pass may comprise the application of one or more effective program voltages without the application of one or more verify voltages. The application of an effective program voltage to a cell may include changing the voltage difference between a control gate and a channel of the cell in order to change the threshold voltage of the cell. Thus, the voltage of a wordline (coupled to the control gate of the target cell) and/or a channel of the cell may be set in order to effectuate application of an effective program voltage. As a "program voltage" is commonly used to refer to a voltage applied to a wordline, the term "effective program voltage" will be used herein to refer to the voltage difference between a control gate and channel of a cell (which in instances where the channel is held at 0 V will be synonymous with program voltage).

In particular embodiments, a logical page of data (i.e., a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106A, if multiple pages are to be programmed in a single pass, multiple logical pages may be loaded from the computing host and programmed in the pass. For example, in memory encoded using a TLC scheme, when the LP and UP are programmed in a single pass, two logical pages of data may be aggregated (where one logical page is stored in the LP and one logical page is stored in the UP).

As mentioned above, a programming pass may program one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is slightly greater than PV2 in the first programming pass (or at least a portion of the way to PV2 so as to be distinguished from cells that are left in a low voltage erased state). If a particular rightmost bit is to be stored as a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP. As other examples, when the cells of a wordline are encoded using a TLC scheme or a QLC scheme, all pages may be programmed during a single programming pass by setting the voltage levels of the cells to the desired program level, or one or more of the pages may be programmed during a first programming pass and the remaining pages programmed during a second pass (or the remaining pages may be programmed using multiple additional passes). For example, in a TLC scheme, a first pass may encode an LP and a second pass may encode the UP and the XP or a first pass may encode an LP and UP and a second pass may encode the XP. As another example, in a QLC scheme, a first pass may encode the LP and a second pass may encode the UP, XP, and TP; a first pass may encode an LP and a UP and a second pass may encode the XP and the TP; or a first pass may encode the LP, UP, and XP and a second pass may encode the TP.

As used herein, "lower page(s)" may refer to one or more pages that are programmed in a first programming pass and "upper page(s)" may refer to one or more pages that are programmed in one or more subsequent programming passes. These designations may be distinguished from the Lower Page (LP) and Upper Page (UP) previously described (in general a Lower Page will be a lower page as used herein when multiple programming passes are used while an Upper Page may be a lower page or an upper page depending on whether it is programmed in the first programming pass or in a subsequent programming pass). Thus, in an MLC scheme, a lower page (e.g., the LP) may be programmed in a first programming pass and an upper page (e.g., the UP) may be programmed in a second programming pass. As another example, in a TLC scheme, a lower page (e.g., the LP) may be programmed in a first programming pass and upper pages (e.g., the UP and the XP) may be programmed in a second programming pass or lower pages (e.g., the LP and the UP) may be programmed in a first programming pass and an upper page (e.g., the XP) may be programmed in a second programming pass. As another example, in a QLC scheme, a lower page (e.g., the LP) may be programmed in a first programming pass and upper pages (e.g., the UP, XP, and TP) may be programmed in a second programming pass. As another example, in a different QLC scheme, lower pages (e.g., the LP and the UP) may be programmed in a first programming pass and upper pages (e.g., the XP and the TP) may be programmed in a second programming pass. In yet another example, in a different QLC scheme, lower pages (e.g., the LP, UP, and XP) may be programmed in a first programming pass and an upper page (e.g., the TP) may be programmed in a second programming pass. Any other suitable permutations of pages programmed in programming passes is contemplated in this disclosure including multiple passes being used to program the upper pages.

In particular embodiments, if multiple programming passes are used to program the cells of a first wordline (or a portion thereof), one or more programming passes may be performed on one or more adjacent wordlines (or portions thereof) after an initial programming pass is performed on the first wordline and before an additional programming pass is performed on the first wordline. Such embodiments may mitigate the effects of interference caused to cells by the programming of neighboring wordlines. In other embodiments, multiple passes may be performed on the cells of a wordline before the next wordline is programmed.

Figure 4:
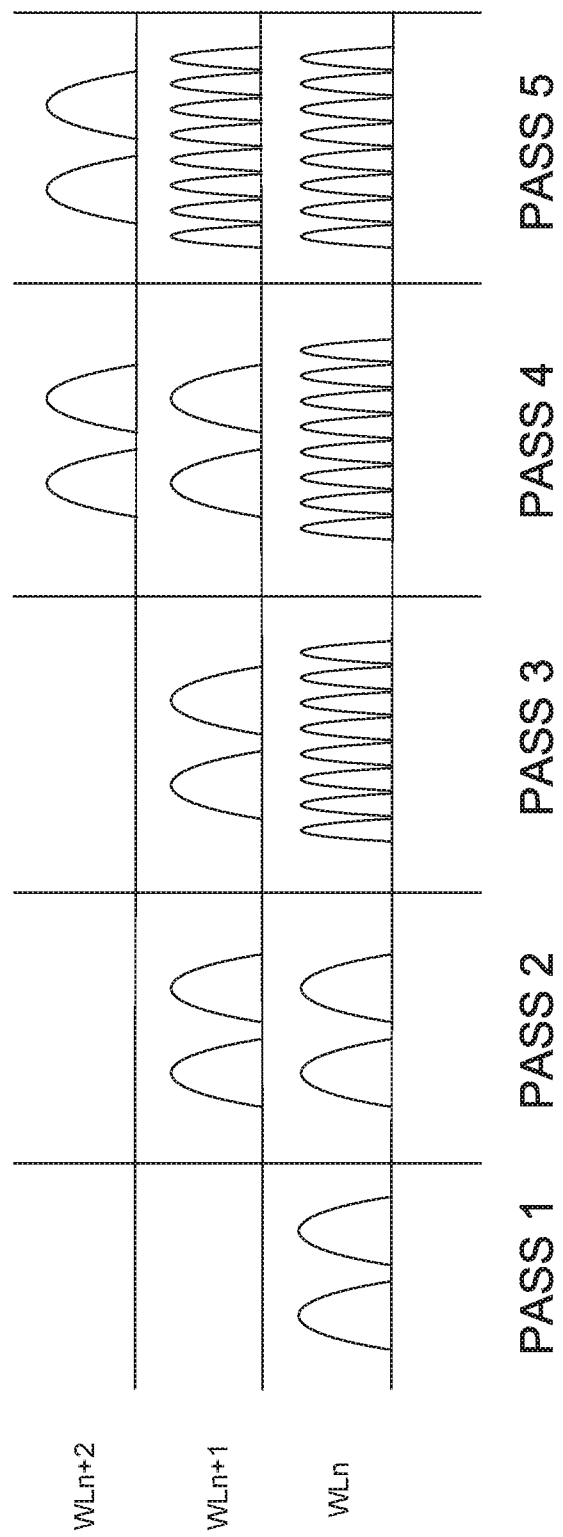
FIG. 4 illustrates an example two pass programming sequence of TLC NAND flash memory cells in accordance with certain embodiments.

FIG. 4 illustrates an example two pass programming sequence of TLC NAND flash memory cells in accordance with certain embodiments. The number of elliptical regions in FIG. 4 may represent a level of encoding. For example, during programming pass 1, the LP is programmed as the cells of wordline n are encoded to two levels and during programming pass 3 the UP and XP are programmed by encoding the cells to eight levels (i.e., the number of levels used to represent three bits in a TLC encoding scheme). Thus in pass 1, the threshold voltages of particular cells of wordline n may be raised part of the way to their target values while in pass 3, the threshold voltages of the cells are raised the remaining amount to their target values (or are inhibited if they have already reached their target values). During passes 2, 4, and 5, the threshold voltages of the cells of wordline n are not deliberately changed (i.e., programmed), and relatively small changes to such threshold voltages (if any) of the cells of wordline n during these passes would be due to interference from the programming of the cells of a different wordline.

In the embodiment shown in FIG. 4, all of the cells are programmed according to a TLC scheme. In pass 1, wordline n is programmed from an erase state (e.g., a low threshold voltage) to two levels. In pass 2, the adjacent wordline n+1 is programmed to two levels. In pass 3, the wordline n is then programmed to eight levels. In pass 4, wordline n+2 is programmed to two levels. In pass 5, the wordline n+1 is programmed to eight levels. The effect of the programming of wordline n+1 on the cells of wordline n during pass 5 is mitigated because the threshold voltages of the cells of wordline n+1 are not changing as much as they would have changed if they had been programmed to eight levels in a single pass. Accordingly, the encodings stored by the cells of wordline n may retain their programmed values. The programming sequence could continue with wordline n+3 (not shown) being programmed to two levels in a sixth pass, and wordline n+2 being programmed to eight levels in a seventh pass, and so on. Accordingly, in this embodiment, the cells of each wordline go through two programming passes before being programmed to the target program levels.

In various embodiments, before the second programming pass is performed on a particular wordline, the lower page(s) that were programmed in the first programming pass are read in a "pre-read" operation. Since the target program level of each cell is based on the combination of bits to be programmed into a cell, the data of the lower page(s) is accessed in combination with the data of the upper page(s) during the second programming pass to determine the target program levels of the cells. In various embodiments, when the data of the lower page(s) is loaded prior to the first programming pass, it may be stored in memory elements (such as one or more sets of latches) which control the values that are programmed into cells of the wordline. However, prior to the second programming pass, the values may be lost (e.g., the memory elements may be overwritten by one or more other pages that are to be written to one or more other wordlines or portions thereof in between the first programming pass and the second programming pass). Accordingly, prior to performing the second programming pass on a group of cells, the lower page(s) are pre-read from the group of cells and stored in memory elements. Additional memory elements may store the upper page(s) and the values of the lower page(s) and upper pages(s) are used in conjunction with each other during the second programming pass to move the cells to their proper program levels.

The upper page(s) may be received through a data load operation which may comprise one or more data load commands. In conjunction with a data load command, storage device controller 118 may receive an address at which data is to be programmed and the data (e.g., a page) to be programmed. In various embodiments, a data load command directs the loading of a page of data from a host (e.g., CPU 102) into memory elements (e.g., of a memory module 122A) to be used during a programming pass.

In various systems, the pre-read of the lower page(s) that are already stored in a group of cells is performed after all of the data of the upper page(s) destined for those cells have been loaded. However, such systems introduce unnecessary latency into the programming sequence. Various embodiments herein provide methods and systems for initiating the pre-read operation prior to completion of the data load operation in order to reduce the program time.

Figure 5:
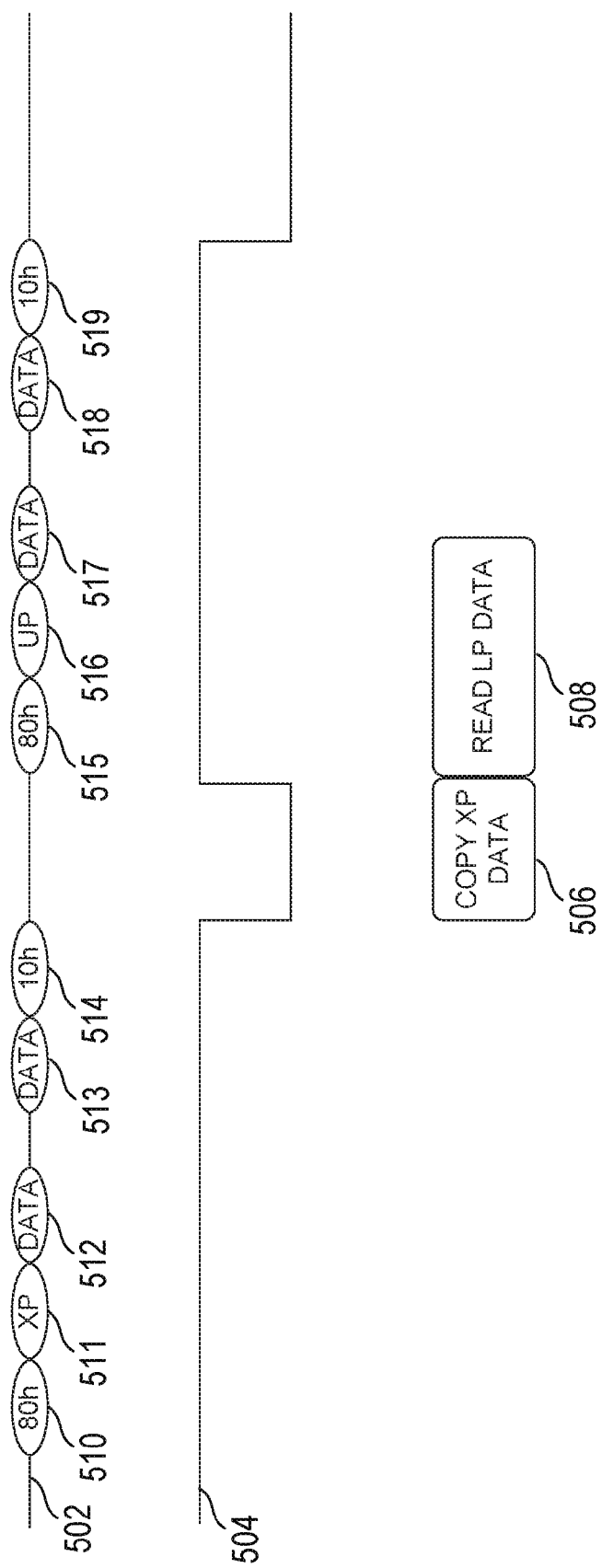
FIG. 5 illustrates an example sequence of a pre-read operation and a data load operation in accordance with certain embodiments.

FIG. 5 illustrates an example sequence of a pre-read operation and a data load operation for a second programming pass of TLC NAND flash memory cells in accordance with certain embodiments. In the embodiment depicted, a command line 502, a read/busy line 504, and internal operations 506 and 508 are shown. In this embodiment, it is assumed that an LP was programmed during a first pass.

Command line 502 may comprise one or more communication channels over which storage device controller 118 may receive command signals and data signals from a host. In the embodiment depicted, two data load commands are depicted, with the first data load command comprising operations 510-514 and the second data load command comprising operations 515-519. In a particular embodiment, an operation occupies one or more clock cycles of the storage device 106A. At operation 510, signals (e.g., a data input command such as an 80h instruction) indicating the start of a data load command are received. At operation 511, an address of an upper page is received. For example, in the embodiment depicted, an address of an XP is received at 511. During operations 512 and 513, data comprising the upper page (e.g., XP) is received. Any suitable number of sets of data of the XP may be sent over command line 502 in between operations 512 and 513. At 514, signals (e.g., a program command such as a 10h instruction) indicating the end of a data load command are received. Operation 514 may trigger the loading of the upper page (e.g., XP) data into memory elements of the memory module 122A corresponding to the address.

In various embodiments, a memory module 122A may include a set of memory elements (e.g., latches) that interface with the storage device controller 118 to receive data that is loaded from a host via a data load command (hereinafter referred to as the "load memory element set"). In various embodiments, such memory elements may comprise a set of latches, such as SDC latches. The memory module 122A may also include one or more sets of memory elements (e.g., latches) that do not interface with the storage device controller 118 to receive data loaded from a host via a data load command, but are able to store data read during a pre-read operation or are able to receive and store a copy of data stored in the load memory element set. In various embodiments, such memory elements may comprise one or more sets latches, such as PDC latches. Accordingly, when two or more pages of data are to be loaded prior to a programming pass, a first page may be loaded in the load memory element set and then copied to another set of memory elements of the memory module 122A to make room for an additional page of data to be loaded into the load memory element set. Accordingly, in the embodiment depicted, after the first data load command is completed, operation 506 occurs wherein the XP data is copied from the load memory element set into another memory element set so that data received during the second data load command may be loaded into the load memory element set. In various embodiments, while the XP data is being copied from the load memory element set, the load memory element set is unable to accept new data. Accordingly, the read/busy line 504 goes low at the start of the copy operation 506 to signal to the host that new data cannot be accepted.

Upon completion of the copy operation, the read/busy line 504 transitions back to its previous state and an additional data load command may be received and an additional upper page (e.g., the UP) may be loaded into the load memory element set (in some embodiments, the data load command associated with the loading of the UP data could begin before the copying of the XP data is complete since the actual load into the load memory element set may occur at the end of the data load command though if the read/busy line is coupled to the host, the host may wait until this line transitions to send an additional data load command). At operation 515, signals (e.g., an 80h instruction) indicating the start of a data load command are received. At operation 516, an address of a different upper page is received. For example, in the embodiment depicted, an address of a UP is received at 516. During operations 517 and 518, data comprising the UP is received. Any suitable number of sets of data including data of the UP may be sent over command line 502 in between operations 517 and 518. At 519, signals (e.g., a 10h instruction) indicating the end of a data load command are received. Operation 519 may trigger the loading of the UP data into the load memory element set of the memory module 122A which correspond to the address of the UP.

In various embodiments, the pre-read of the lower page(s) is initiated prior to completion of the data load operation (i.e., prior to the end of the last data load command of the data load operation). In particular embodiments, the pre-read of the lower page(s) is performed in parallel with at least a portion of one or more data load commands (e.g., in the embodiment depicted the pre-read of the LP data is occurring at the same time as the second data load command and in other embodiments at least part of the data read may occur in parallel with the first data load command). In some embodiments, the pre-read of the lower page(s) data may be completed prior to completion of the data load operation (i.e., before the last data load command finishes). In the embodiment depicted, the pre-read of the LP data begins after the XP data is copied from the load memory element set, but the pre-read of the lower page(s) data may be triggered at any suitable time once the location of the LP data to be read is ascertained. In one embodiment, the location of the lower page(s) data is ascertained based on the address of an upper page (e.g., XP or UP in the depicted embodiment) of a data load command. For example, the address of the upper page may identify the group of memory cells into which the upper page is to be programmed which is the same group of memory cells that store the lower page(s) that are to be read in the pre-read operation.

The pre-read operation may be triggered at any suitable time. As various examples, the pre-read operation may be triggered when the address of an upper page (e.g., the UP, XP, or TP) is received, when all of the data of an upper page (e.g., the UP, XP, or TP) has been received, when an instruction (e.g., 10h instruction) signifying the end of a data load command is received, when the copying of an upper page (e.g., the UP, XP, or TP) from the load memory element set is complete, when the data input command (e.g., 80h) of an upper page is received (e.g., at 515) after an address of a different upper page has been received, or at any other suitable time.

Once the data load operation and the pre-read operation have completed, the second programming pass may be performed based on the page data stored in the memory element sets of the memory module 122A.

Although the example above depicts a TLC encoding scheme in which two upper pages are programmed during the second pass, various embodiments of the present disclosure may involve any other suitable programming sequences in which a pre-read may be initiated (and/or completed) prior to the completion of the data load operation, whether the data load operation involves loading one, two, three, or more upper pages and whether the pre-read operation involves reading one, two, three, or other number of lower pages.

As one example (as depicted above), the pre-read of an LP may be initiated at any suitable time during the data load operation prior to a second pass programming of a UP and XP in a TLC encoding scheme. As another example, the pre-read of an LP and a UP may be initiated at any suitable time during the data load operation prior to a second pass programming of an XP in a TLC encoding scheme. As another example, the pre-read of an LP and a UP may be initiated at any suitable time during the data load operation prior to a second pass programming of an XP and a TP in a QLC encoding scheme. As another example, the pre-read of an LP, a UP, and an XP may be initiated at any suitable time during the data load operation prior to a second pass programming of a TP in a QLC encoding scheme.

Figure 6:
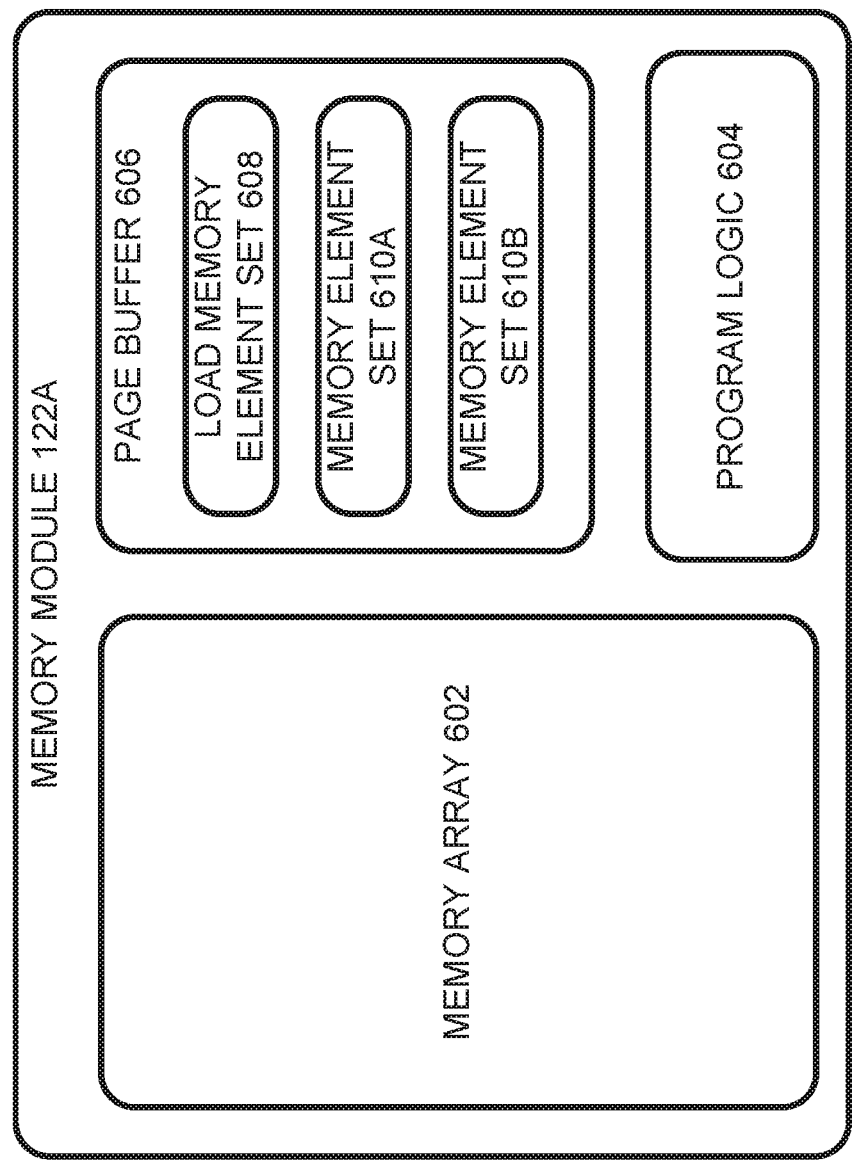
FIG. 6 illustrates an example memory module in accordance with certain embodiments.

FIG. 6 illustrates an example memory module 122A in accordance with certain embodiments. The memory module 122A includes a memory array 602 which in various embodiments may comprise a NAND flash memory array. Memory module 122A also includes program logic 604 which may interface with program control logic 124 of the storage device controller 118 and may facilitate the performance of various operations on the memory array 602.

Memory module 122A also includes at least one page buffer 606 which includes a load memory element set 608 and memory element sets 610A and 610B. As described above, load memory element set 608 may be operable to store data loaded from the host and copy the data to one of the other memory element sets 610A or 610B in order to make room to load additional data from the host. Either of 610A or 610B may be operable to store a lower page read during a pre-read operation. The memory element sets depicted in FIG. 6 may be implemented using any suitable type of memory elements, such as latches, flip flops, or other memory elements. In other embodiments, a memory module 122A could have additional memory elements sets (e.g., four memory sets would be used to hold different pages during a second programming pass of a QLC scheme).

Figure 7:
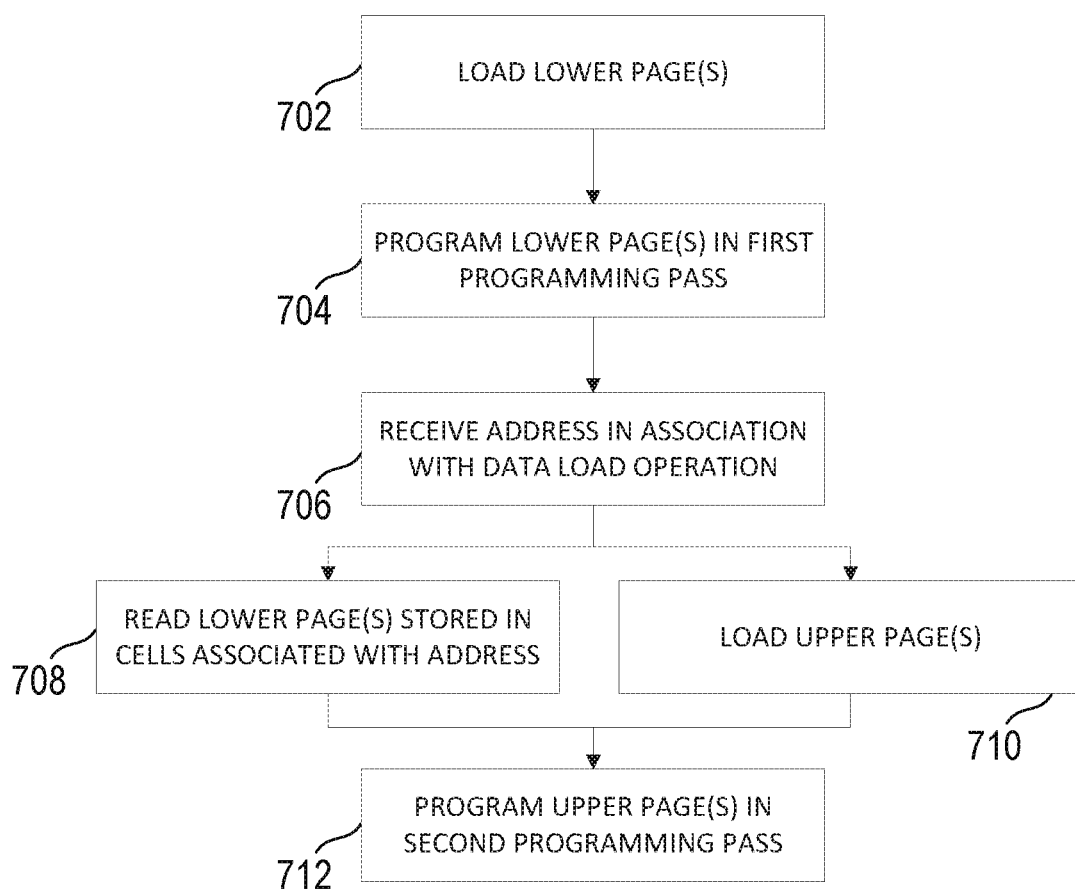
FIG. 7 illustrates an example flow for initiating a pre-read operation before completion of a data load operation in accordance with certain embodiments.

FIG. 7 illustrates an example flow 700 for initiating a pre-read operation before completion of a data load operation in accordance with certain embodiments. The flow 700 depicts example operations that may be performed by any suitable logic, such as a storage device controller 118, memory 116, and/or a memory module 122A.

At 702, one or more lower pages are loaded. As one example, an LP is loaded. As another example, an LP and a UP are loaded. As yet another example, an LP, UP, and XP are loaded. Loading may comprise receiving data from a host and placing the data in one or more memory element sets that may be used to control the target program levels of the cells in which the lower page(s) are to be stored. At 704, the lower page(s) are programmed in a first programming pass.

At 706, an address is received in association with a data load operation. For example, the address may be received in a data load command of the data load operation (where the data load operation could include a data load command for each upper page that is loaded during the data load operation). The address may specify a group of memory cells to store data specified by the data load command. In various embodiments, the address may be a virtual address that is translated to a physical address by the storage device controller 118. In a particular embodiment, multiple virtual addresses may correspond to the same physical address (e.g., virtual addresses for a UP and an XP to be stored in the same group of cells may translate to the same physical address). The physical address at which the upper page(s) are to be stored indicates a group of memory cells on which a pre-read operation is to be performed in order to access the lower page(s) stored in the group of memory cells.

At 708, lower page(s) stored in the memory cells associated with the received address are read in a pre-read operation. At 710, upper page(s) are loaded during the data load operation. These operations are shown in parallel as in some embodiments at least a portion of the pre-read operation may be performed simultaneously with at least a portion of the loading of the upper page(s). In various embodiments, the pre-read operation is completed before all of the upper page(s) are finished loading. Any suitable upper pages may be loaded at this step, such as an XP; a UP and an XP; a TP; an XP and a TP; a UP, XP, and TP; or other suitable combination of upper pages. At 712, the upper page(s) are programmed in a second programming pass.

The flow described in FIG. 7 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 7 may be repeated, combined, modified or deleted where appropriate. Additionally, operations may be performed in any suitable order without departing from the scope of particular embodiments.

Although various embodiments have been described with respect to particular encoding schemes (e.g., MLC, TLC, QLC), the teachings of such embodiments may be equally applicable to memories using any suitable encoding levels, including encoding schemes that become feasible in the future.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106A, system memory device 107, memory 116, memory modules 122A-D, storage device controller 118, address translation engine 120, program control logic 124, sense circuitry 220, program logic 604, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1 's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a storage device comprising a NAND flash memory array, the storage device to program, during a first programming pass, a plurality of cells of a first wordline of the NAND flash memory array to store a first page of data; initiate a read of the first page of data prior to completion of loading of a second page of data to be programmed to the plurality of cells during a second programming pass; and program, during the second programming pass, the plurality of cells of the first wordline of the NAND flash memory array to store the first page of data and the second page of data.

In an embodiment, the storage device is further to complete the read of the first page of data prior to completion of the loading of the second page of data. In an embodiment, the storage device is further to load a third page of data and program, during the second programming pass, the plurality of cells of the first wordline of the NAND flash memory array to also store the third page of data. In an embodiment, the storage device is further to program, during the first programming pass, the plurality of cells of the first wordline of the NAND flash memory array to store a third page of data; and wherein initiating a read of the first page of data prior to completion of loading of a second page of data to be programmed during the second programming pass is to also initiate a read of the third page of data. In an embodiment, wherein the storage device is to initiate the read of the first page of data in response to receiving an address of the second page of data. In an embodiment, the storage device is to initiate the read of the first page of data in response to receiving an address of a third page of data to be programmed during the second programming pass. In an embodiment, the storage device is to initiate the read of the first page of data in response to determining that all of the second page of data has been received. In an embodiment, the storage device is to initiate the read of the first page of data in response to an indication that the second page of data has been copied from a first set of memory latches to a second set of memory latches. In an embodiment, the storage device is to initiate the read of the first page of data in response to receiving a program instruction associated with a third page of data. In an embodiment, the storage device is to read the first page of data while the second page of data is being loaded from a host. In an embodiment, the storage device is further to load the second page of data into a first latch set of a memory module and copy the second page of data from the first latch set to a second latch set of the memory module prior to the second programming pass. In an embodiment, the storage device is further to load a third page of data into the first latch set prior to the second programming pass, wherein the second programming pass causes the plurality of cells of the first wordline of the NAND flash memory array to further store the third page of data.

In at least one embodiment, a method comprises programming, during a first programming pass, a plurality of cells of a first wordline of a NAND flash memory array to store a first page of data; initiating a read of the first page of data prior to completion of loading of a second page of data to be programmed to the plurality of cells during a second programming pass; and programming, during the second programming pass, the plurality of cells of the first wordline of the NAND flash memory array to store the first page of data and the second page of data.

In an embodiment, the method further comprises completing the read of the first page of data prior to completion of the loading of the second page of data. In an embodiment, the method further comprises loading a third page of data and programming, during the second programming pass, the plurality of cells of the first wordline of the NAND flash memory array to also store the third page of data. In an embodiment, the method further comprises programming, during the first programming pass, the plurality of cells of the first wordline of the NAND flash memory array to store an additional page of data; and wherein initiating a read of the first page of data prior to completion of loading of a second page of data to be programmed during the second programming pass is to also initiate a read of the additional page of data. In an embodiment, the method further comprises initiating the read of the first page of data in response to receiving an address of the second page of data. In an embodiment, the method further comprises initiating the read of the first page of data in response to receiving an address of a third page of data to be programmed during the second programming pass. In an embodiment, the method further comprises initiating the read of the first page of data in response to determining that all of the second page of data has been received. In an embodiment, the method further comprises initiating the read of the first page of data in response to an indication that the second page of data has been copied from a first set of memory latches to a second set of memory latches. In an embodiment, the method further comprises initiating the read of the first page of data in response to receiving a program instruction associated with a third page of data. In an embodiment, the method further comprises reading the first page of data while the second page of data is being loaded from a host. In an embodiment, the method further comprises loading the second page of data into a first latch set of a memory module and copying the second page of data from the first latch set to a second latch set of the memory module prior to the second programming pass. In an embodiment, the method further comprises loading an additional page of data into the first latch set prior to the second programming pass, wherein the second programming pass causes the plurality of cells of the first wordline of the NAND flash memory array to further store the additional page of data. In an embodiment, a system comprises means to perform any of these methods. In an embodiment, the means comprise machine-readable code that when executed, cause a machine to perform one or more steps of any of these methods. In an embodiment, the system further comprises a battery communicatively coupled to a processor, a display communicatively coupled to the processor, or a network interface communicatively coupled to the processor.

In at least one embodiment, a system comprises a processor to send data load commands to a storage device; and a storage device comprising a NAND flash memory comprising at least one NAND flash memory array; and a storage device controller to cause to be programmed, during a first programming pass, a plurality of cells of a first wordline of the NAND flash memory array to store a first page of data; initiate a read of the first page of data prior to completion of loading of a second page of data to be programmed to the plurality of cells during a second programming pass; and cause to be programmed, during the second programming pass, the plurality of cells of the first wordline of the NAND flash memory array to store the first page of data and the second page of data.

In an embodiment, the read of the first page of data is completed prior to completion of the loading of the second page of data. In an embodiment, the storage device controller is further to load a third page of data and cause to be programmed, during the second programming pass, the plurality of cells of the first wordline of the NAND flash memory device to also store the third page of data. In an embodiment, the system further comprises one or more of a battery communicatively coupled to the processor, a display communicatively coupled to the processor, or a network interface communicatively coupled to the processor.

In at least one embodiment, a system comprises means for programming, during a first programming pass, a plurality of cells of a first wordline of a NAND flash memory array to store a first page of data; means for initiating a read of the first page of data prior to completion of loading of a second page of data to be programmed to the plurality of cells during a second programming pass; and means for programming, during the second programming pass, the plurality of cells of the first wordline of the NAND flash memory array to store the first page of data and the second page of data.

In an embodiment, the read of the first page of data is completed prior to completion of the loading of the second page of data. In an embodiment, the system further comprises means to load a third page of data and means to program, during the second programming pass, the plurality of cells of the first wordline of the NAND flash memory device to also store the third page of data. In an embodiment, the system further comprises means to program, during the first programming pass, the plurality of cells of the first wordline of the NAND flash memory array to store a third page of data; and initiating a read of the first page of data prior to completion of loading of a second page of data to be programmed during the second programming pass is to also initiate a read of the third page of data. In an embodiment, the read of the first page of data in initiated in response to receiving an address of the second page of data.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a storage device comprising a NAND flash memory array, the storage device to:
program, during a first programming pass, a plurality of cells of a first wordline of the NAND flash memory array to store a first page of data;
initiate a read of the first page of data from the plurality of cells of the first wordline after completion of the first programming pass and prior to completion of loading of a second page of data to be programmed to the plurality of cells during a second programming pass; and
program, during the second programming pass, the plurality of cells of the first wordline of the NAND flash memory array to store the first page of data and the second page of data.

2. The apparatus of claim 1, the storage device further to complete the read of the first page of data prior to completion of the loading of the second page of data.

3. The apparatus of claim 1, the storage device further to load a third page of data and program, during the second programming pass, the plurality of cells of the first wordline of the NAND flash memory array to also store the third page of data.

4. The apparatus of claim 1, the storage device further to:
program, during the first programming pass, the plurality of cells of the first wordline of the NAND flash memory array to store a third page of data; and
wherein initiating a read of the first page of data prior to completion of loading of a second page of data to be programmed during the second programming pass is to also initiate a read of the third page of data.

5. The apparatus of claim 1, wherein the storage device is to initiate the read of the first page of data in response to receiving an address of the second page of data.

6. The apparatus of claim 1, wherein the storage device is to initiate the read of the first page of data in response to receiving an address of a third page of data to be programmed during the second programming pass.

7. The apparatus of claim 1, wherein the storage device is to initiate the read of the first page of data in response to determining that all of the second page of data has been received.

8. The apparatus of claim 1, wherein the storage device is to initiate the read of the first page of data in response to an indication that the second page of data has been copied from a first set of memory latches to a second set of memory latches.

9. The apparatus of claim 1, wherein the storage device is to initiate the read of the first page of data in response to receiving a program instruction associated with a third page of data.

10. The apparatus of claim 1, wherein the storage device is to read the first page of data while the second page of data is being loaded from a host.

11. The apparatus of claim 1, wherein the storage device is further to load the second page of data into a first latch set of a memory module and copy the second page of data from the first latch set to a second latch set of the memory module prior to the second programming pass.

12. The apparatus of claim 11, wherein the storage device is further to load a third page of data into the first latch set prior to the second programming pass, wherein the second programming pass causes the plurality of cells of the first wordline of the NAND flash memory array to further store the third page of data.

13. A method comprising:
programming, during a first programming pass, a plurality of cells of a first wordline of a NAND flash memory array to store a first page of data;
initiating a read of the first page of data from the plurality of cells of the first wordline after completion of the first programming pass and prior to completion of loading of a second page of data to be programmed to the plurality of cells during a second programming pass; and
programming, during the second programming pass, the plurality of cells of the first wordline of the NAND flash memory array to store the first page of data and the second page of data.

14. The method of claim 13, further comprising completing the read of the first page of data prior to completion of the loading of the second page of data.

15. The method of claim 13, further comprising loading a third page of data and programming, during the second programming pass, the plurality of cells of the first wordline of the NAND flash memory device to also store the third page of data.

16. The method of claim 13, further comprising:
programming, during the first programming pass, the plurality of cells of the first wordline of the NAND flash memory array to store a third page of data; and
wherein initiating a read of the first page of data prior to completion of loading of a second page of data to be programmed during the second programming pass is to also initiate a read of the third page of data.

17. A system comprising:
a processor to send data load commands to a storage device; and
a storage device comprising:
a NAND flash memory comprising at least one NAND flash memory array; and
a storage device controller to:
cause to be programmed, during a first programming pass, a plurality of cells of a first wordline of the NAND flash memory array to store a first page of data;
initiate a read of the first page of data from the plurality of cells of the first wordline after completion of the first programming pass and prior to completion of loading of a second page of data to be programmed to the plurality of cells during a second programming pass; and
cause to be programmed, during the second programming pass, the plurality of cells of the first wordline of the NAND flash memory array to store the first page of data and the second page of data.

18. The system of claim 17, wherein the read of the first page of data is completed prior to completion of the loading of the second page of data.

19. The system of claim 17, the storage device controller further to load a third page of data and cause to be programmed, during the second programming pass, the plurality of cells of the first wordline of the NAND flash memory device to also store the third page of data.

20. The system of claim 17, further comprising one or more of: a battery communicatively coupled to the processor, a display communicatively coupled to the processor, or a network interface communicatively coupled to the processor.

* * * * *

UNITED STATES PATENT AND TRADEMARK OFFICE
CERTIFICATE OF CORRECTION

PATENT NO. : 9,823,880 B1
APPLICATION NO. : 15/281439
DATED : November 21, 2017
INVENTOR(S) : Koichi Kawai et al.

Page 1 of 1

It is certified that error appears in the above-identified patent and that said Letters Patent is hereby corrected as shown below:

In the Claims

In Claim 15, Column 25, Line 27 delete "device" and insert -- array --, therefor.

In Claim 19, Column 26, Line 30 delete "device" and insert -- array --, therefor.

Signed and Sealed this
Sixth Day of March, 2018

Andrei Iancu
*Director of the United States Patent and Trademark Office*